(12) United States Patent
Thiruvengadam et al.

(10) Patent No.: US 9,658,288 B2
(45) Date of Patent: May 23, 2017

(54) ALTERNATING CURRENT COUPLED ELECTRONIC COMPONENT TEST SYSTEM AND METHOD

(71) Applicant: Intel Corporation, Santa Clara, CA (US)

(72) Inventors: Bharani Thiruvengadam, Beaverton, OR (US); Akira Kakizawa, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/207,351

(22) Filed: Jul. 11, 2016

(65) Prior Publication Data

US 2016/0320447 A1    Nov. 3, 2016

Related U.S. Application Data

(63) Continuation of application No. 14/038,284, filed on Sep. 26, 2013, now Pat. No. 9,389,274.

(51) Int. Cl.
*G01R 31/3187* (2006.01)
*G01R 31/28* (2006.01)

(52) U.S. Cl.
CPC ..... *G01R 31/2896* (2013.01); *G01R 31/2853* (2013.01); *G01R 31/2884* (2013.01)

(58) Field of Classification Search
CPC .................. G01R 31/2896; G01R 31/2853
See application file for complete search history.

(56) References Cited

U.S. PATENT DOCUMENTS

| 9,389,274 | B2 | 7/2016 | Thiruvengadam |
| 2009/0027059 | A1 | 1/2009 | Arguello |
| 2011/0080185 | A1 | 4/2011 | Wu et al. |
| 2012/0249178 | A1* | 10/2012 | Su .......................... H01L 22/34 324/762.03 |
| 2013/0006557 | A1 | 1/2013 | Chakrabarty et al. |
| 2015/0084642 | A1 | 3/2015 | Thiruvengadam et al. |

OTHER PUBLICATIONS

"U.S. Appl. No. 14/038,284, Non Final Office Action mailed Nov. 19, 2015", 19 pgs.
"U.S. Appl. No. 14/038,284, Notice of Allowance mailed Mar. 11, 2016", 13 pgs.
"U.S. Appl. No. 14/038,284, Response filed Feb. 19, 2016 to Non Final Office Action mailed Nov. 19, 2015", 14 pgs.

* cited by examiner

*Primary Examiner* — Daniel Miller
(74) *Attorney, Agent, or Firm* — Schwegman Lundberg & Woessner, P.A.

(57) ABSTRACT

This disclosure relates generally to an electrical circuit and method. A capacitive element can be configured to be coupled in series with an electronic package component. A path resistance can be electrically coupled to the capacitive element. A driver can be configured to electrically charge the capacitive element. A voltage detector can be coupled to the capacitive element and configured to identify a condition of the electronic package component based on a measured voltage of the capacitive element.

20 Claims, 7 Drawing Sheets

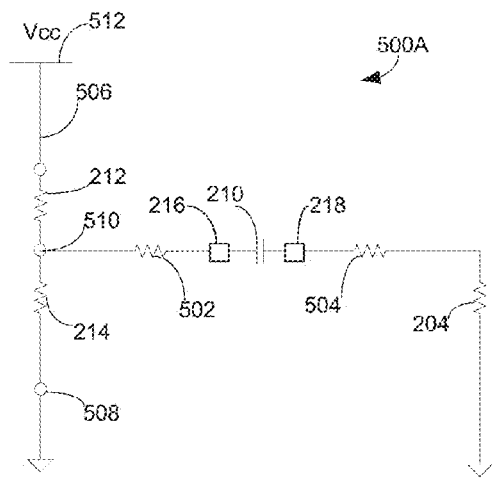
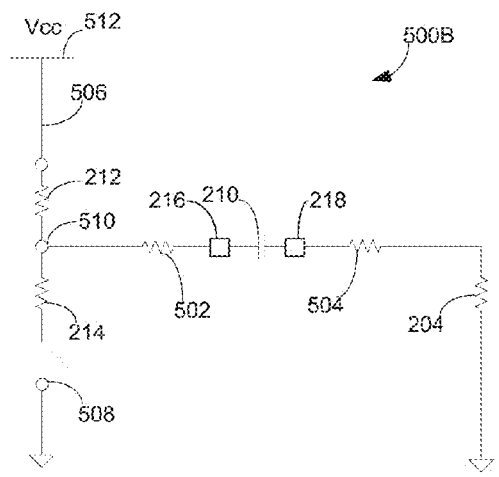
FIG. 5A        FIG. 5B
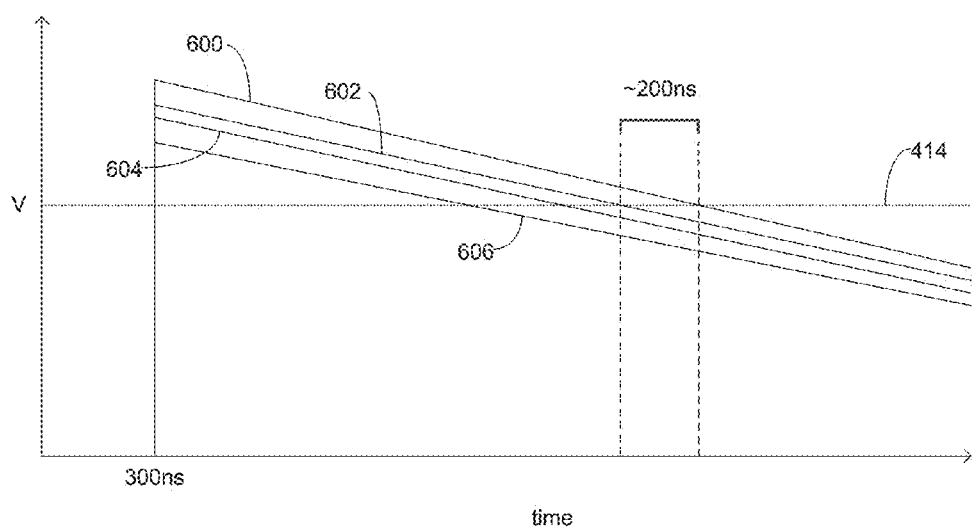
FIG. 6

US 9,658,288 B2

ALTERNATING CURRENT COUPLED ELECTRONIC COMPONENT TEST SYSTEM AND METHOD

CROSS-REFERENCE TO RELATED APPLICATION

This application is a continuation of U.S. patent application Ser. No. 14/038,284, filed Sep. 26, 2013, which is incorporated by reference herein in its entirety.

TECHNICAL FIELD

The disclosure herein relates generally to a system and method for testing for defects in a chip package using alternating current (AC) coupling.

BACKGROUND

Electronic chip packages have long utilized vias, solder bumps, and conductive lines (collectively referred to herein as "interconnects") for coupling different components of the chip package. For instance, a via may extend from a first conductive line in a first layer of the chip package to a second conductive line in a second layer of the chip package. Such interconnects may be tested during or following fabrication of the chip package to verify that the interconnect has appropriately connected the first and second conductive lines with respect to one another.

BRIEF DESCRIPTION OF THE DRAWINGS

FIGS. 5A and 5B show circuit diagrams of an interconnect defect test for a defective interconnect, in an example embodiment.

FIG. 6 shows a simulation results based on various resistances, in an example embodiment.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Conventional chip packaging processes tend to result in a small but measurable percentage of conductive lines that are cracked, vias that are delaminated, or components that are otherwise part of a nonconforming portion of the chip package. Additional chip package components, such as test or solder bumps and conductive lines can similarly be nonconforming. Such nonconformance can be measurable through an impedance variance between defective and operational interconnects of as little as three (3) Ohms. Various testers have coupled to the interconnect to directly measure the impedance. However, such testing can become more difficult and expensive as interconnects specifically, and chip packages generally, become progressively smaller and less accessible. Additionally, such testing can utilize pins on the chip to conduct the testing. In various circumstances, the number of pins can exceed, at times substantially, the number of channels for conducting the test. Further, such testing can involve the use of various components on a load board that can present additional overhead.

An electronic component test has been developed that does not utilize direct contact with the electronic component for testing non-conformance, such as delamination, cracking or other defect in the chip package. Rather, a capacitive element, such as a capacitor, can be coupled with respect to the electronic component and preconditioned with a charge. The capacitor can be preconditioned with an electronic charge and then discharged. Based on the measured voltage of the capacitive element, the conformity or nonconformity of the electronic component can be identified without testing the electronic component with direct contact to the interconnect.

Figure 1:
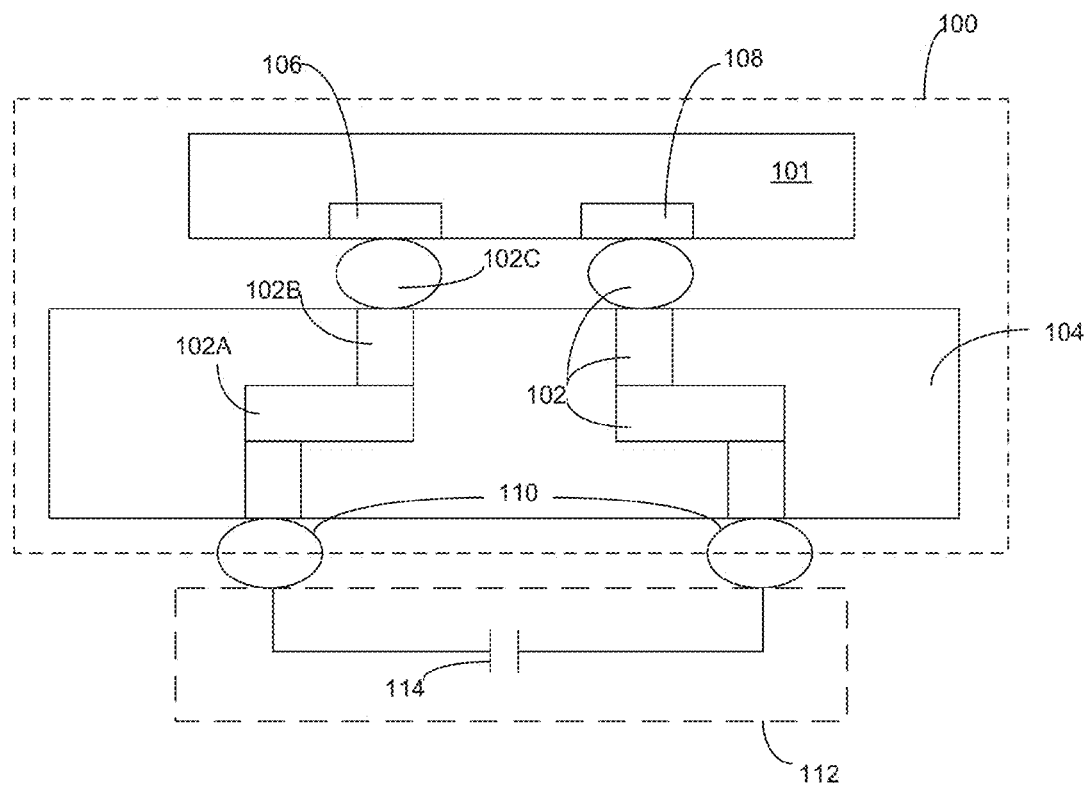
FIG. 1 is schematic cross-sectional profile of an electronic package, in an example embodiment.

FIG. 1 is schematic cross-sectional profile of an electronic package 100, such as a printed circuit board or a chip package. The package 100 optionally includes a die 101 and electrical components, such as conductive lines 102A, interconnects 102B, and solder bumps 102C (herein collectively interconnects 102), within an insulator 104. As illustrated, the die is connected to the rest of the chip package 100 with the solder bumps 102C. In alternative examples, the die 101 is embedded within the insulator 104. It is to be understood that the methodology discussed herein can be applied equally well to any of a variety of electronic components.

The die 101 can be electrically coupled to the interconnects 102. In alternative examples, the package does not include the die 101, such as where the package 100 is a printed circuit board (PCB) or the like. The interconnects 102B can be formed through conventional or laser drilling, through a buildup process, with a scribe process, such as a laser scribe process, or a dry film resist process, among other processes.

As will be disclosed in detail herein, the die 101 as illustrated incorporates a transmitter 106 and a receiver 108 configured to transmit signals throughout the electronic package 100 by way of the solder bumps 102C. The electronic package 100 further has test pins 110 that can be coupled to a test board 112. As illustrated in abstract electrical schematic form, the test board 112 can incorporate a capacitor 114 for the purposes of detecting a defect in an interconnect 102 along a circuit path including the capacitor 114.

Figure 2:
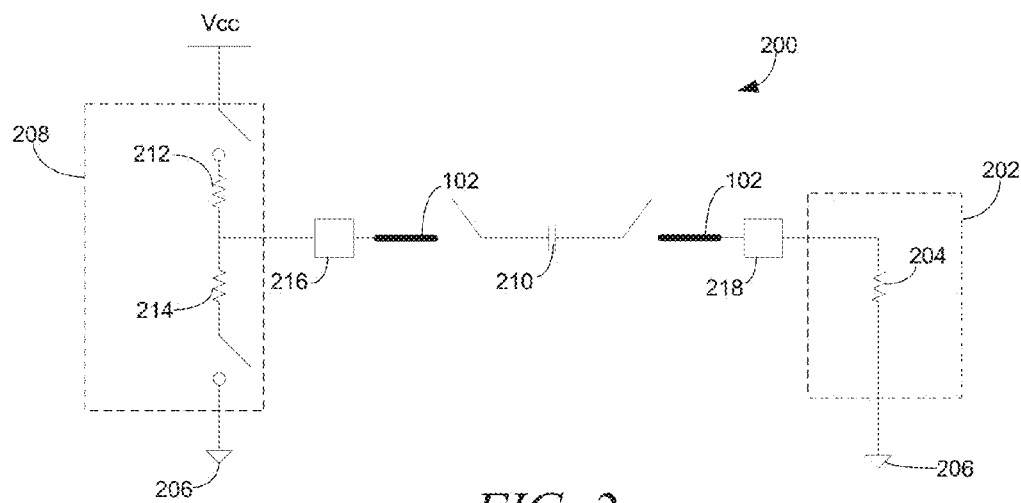
FIG. 2 is a circuit diagram of a circuit 200 that can provide RC decay and/or charge-up based interconnect defect detection using a voltage mode driver, in an example embodiment.

FIG. 2 is a circuit diagram of a circuit 200 that can provide RC decay and/or charge-up based interconnect defect detection using a voltage mode driver. The components of the circuit 200 can correspond to components as illustrated in FIG. 1. A receiver 202, such as can correspond to the receiver 108, optionally includes, but is not necessarily limited to, a resistive terminator 204 to ground 206. A transmitter 208, such as can correspond to the transmitter 106, is connected with the receiver 202 in an input/output loop back (IOLB) path with a capacitive element, such as an AC coupling capacitor 210, such as can correspond to the capacitor 114, therebetween. In various examples, the capacitor 210 is in the range of approximately 100 nanoFarads to 220 nanoFarads. The transmitter 208 optionally includes, but is not necessarily limited to, a pull-up driver 212 and a pull-down driver 214. It is to be recognized and understood that alternative examples can include alternative or additional components for the receiver 202 and the transmitter 208.

As illustrated, the interconnect 102 can be coupled between a transmitter node 216 and receiver node 218 in series with the capacitor 210. In various examples, the interconnect 102 is connectably or switchably coupled in series with the capacitor 210, and multiple interconnects 102 can be separately, selectively coupled in series with the capacitor 102. In an example, the capacitor 210 is coupled by bringing the test board 112 in contact with the test points 110 to couple the capacitor 114, 210 within the IOLB path.

The circuit 200 can include an (IOLB) path resistance from resistance induced from the transmitter 208, the receiver 202, and the interconnect 102 as coupled into the system. The transmitter node 216 can be preconditioned to ground by enabling the pull-down driver 214. The receiver node 218 can be inherently preconditioned to ground due to the resistive terminator 204. The circuit 200 can be held in that configuration until the transmitter and receiver nodes 216, 218 are preconditioned at ground.

Figure 3A:
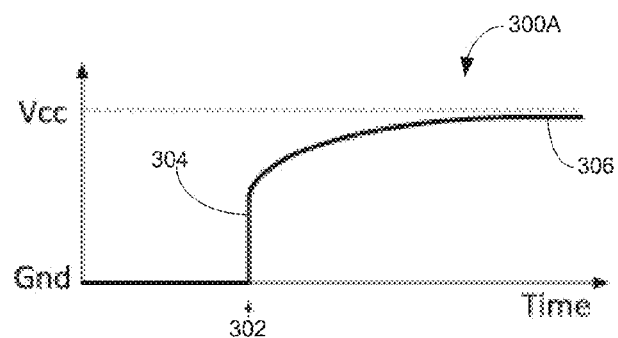
FIGS. 3A and 3B illustrate example response curves at a transmitter node and a receiver node, respectively, in an example embodiment.
Figure 3B:
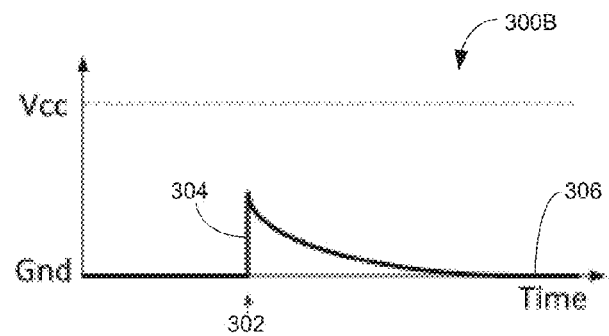

FIGS. 3A and 3B illustrate example response curves 300A, 300B, respectively, at the transmitter node 216 and the receiver node 218, respectively. As illustrated, upon switching from the pull-down driver 214 to the pull-up driver 212 at time zero 302, the capacitor 210 can essentially function as a short. The voltage across the capacitor 210 can spike 304 before settling to a steady state 306, at Vcc for the transmitter node 216 and at ground for the receiver node 218. Because an interconnect defect or other non-conformity can manifest as a change in resistance in the IOLB path, the decay or charge-up time can be a function of the resistance in series with the transmitter 208 and receiver 202, and in particular, with the engaged driver 212, 214 and the resistive terminator 204.

In an example implementation, the total path resistance for the IOLB path is fifty (50) Ohms between the engaged driver 212, 214 and the resistive terminator 204. An RC time constant with a 0.1 microFarad capacitor 210 would therefore be five (5) microseconds. Using a standard capacitor discharge equation $v(t)=V_0 \ast e^{-t/RC}$, where Vcc is one (1) Volt, the voltage on the capacitor 210 at five (5) microseconds would be 0.368 Volts.

However, if a defective interconnect 102 is added to the circuit 200, such as in series with the capacitor 210, the total resistance for the example IOLB path would be fifty-three (53) Ohms, giving a RC time constant of 5.3 microseconds. Using the standard capacitor discharge equation where Vcc is one (1) Volt, the voltage on the capacitor 210 at 5.3 microseconds would be 0.389 Volts. Thus, the difference in voltage at the capacitor 210 in this example would be 0.368-0.389 Volts or twenty-one (21) millivolts to detect an interconnect defect or other circuit non-conformity. Alternatively, an RC decay of three hundred (300) nanoseconds can be detected to detect an interconnect defect.

Figure 4:
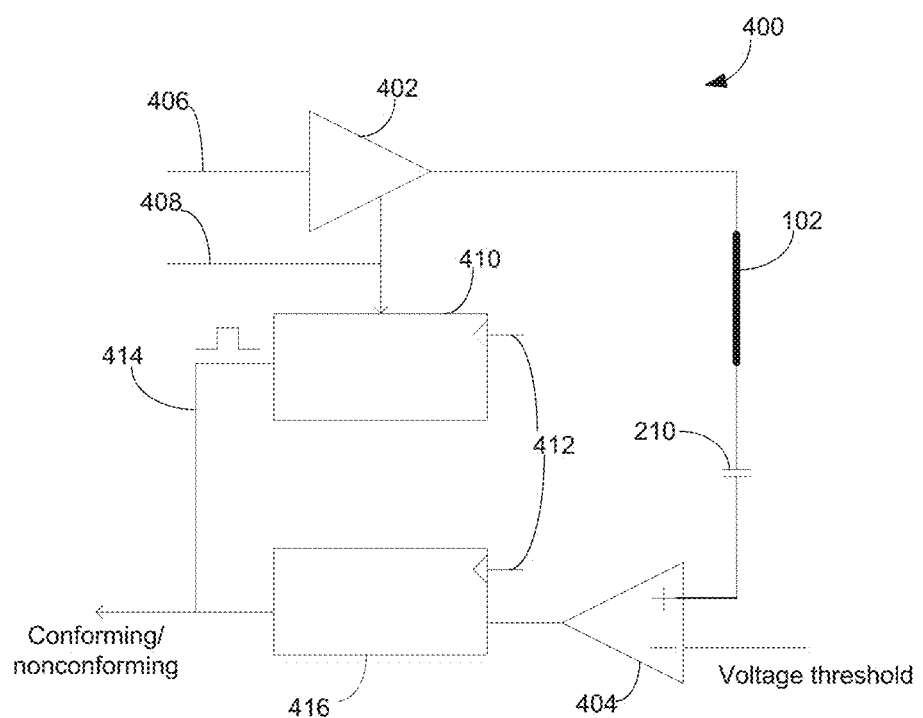
FIG. 4 is circuit diagram of an electronic package test circuit, in an example embodiment.

FIG. 4 is circuit diagram of an electronic package test circuit 400. A transmitter 402, such as the transmitter 208 or other suitable transmitter block, and a voltage detector 404, such as a comparator which can act as a decay detector to detect a decay in the charge on the capacitor 210, can compare the output from the receiver 202 or other suitable receiver with a threshold, bookend a interconnect 102 and a capacitor 210. It is to be recognized that the decay detector 404 can incorporate other componentry of the test circuit 400 and/or can incorporate alternative componentry as can be suitable for detecting a decay in the charge of the capacitor 210.

The transmitter 402 is preconditioned by a preconditioning line 406. The transmitter 402 is triggered off of a start line 408 that also runs into a counter block 410. The counter block 410 triggers off of a clock line 412 and provides a digital enable signal on the output line 414. A one-to-zero edge detector 416 likewise triggers off of the clock line 412 and digitally indicates a nonconforming interconnect 102 based on the output from the receiver 404.

As disclosed above, as resistance is introduced from the nonconforming interconnect 102 the decay or charge-up time constant can increase. A longer time constant can correspond to a small change in voltage, increasing the sensitivity and/or gain requirements of the decay detector 404. A shorter time constant can reduce the sensitivity and/or gain requirement of the comparator 404 but increases the counter clock frequency to capture the time of the decay and/or charge-up. The counter 410 clock 412 frequency can set the resolution of the test in the time domain. The resistance variability of the driver 212, 214 and the termination resistors 404 can be addressed by providing appropriate range in the counter 410.

A single comparator 404 can be utilized to test multiple interconnects 102 with capacitors 210, such as by switching the interconnects 102 in and out of the circuit 400 and/or by selecting, multiplexing or otherwise managing the results from multiple inter. In various examples, the results of multiple interconnects 102 can be compared, such as by a processor or other controller. Comparing the results of various interconnects 102 can tend to identify systemic mismatches in, for instance, the drivers 212, 214.

In an example, the drivers 212 and 214 can be rated at the same resistance value but can in fact vary by approximately 1.5 Ohms. By comparing the results of multiple drivers 212, 214, systemic mismatches can be identified. The circuit 400 can compensate for the systemic mismatches, such as by altering detection thresholds among various components, such as the counter 410 and the edge detector 416, to account for the systemic mismatch. In an example, a systemic mismatch of 1.5 Ohms can be compensated to a fraction of an Ohm.

In contrast with the methodology outlined with respect to FIG. 4 above, the circuit diagram 200 can permit identifying an interconnect defect without the use of a counter 410. Rather, the magnitude of the voltage spike 304 can be measured at a test point 216, 218.

In an example, the total path resistance for the IOLB path is one hundred (100) Ohms between the engaged driver 212, 214 (in the example, fifty (50) Ohms each) and the resistive terminator 204 (in the example, fifty (50) Ohms). The capacitor 210 is charged to one (1) Volt by closing the pull-up driver 212 and opening the pull-down driver 214. In such an example, the current over the path would be ten (10) milliAmperes and a voltage spike over the resistive terminator 204 would be 50 Ohms*10 milliAmperes=500 millivolts.

However, incorporating a defective interconnect 102 into the path resistance, such as having three (3) Ohms of added resistance, would produce a current over the path of 1

Volt/103 Ohms=9.7 milliAmperes and a voltage spike of 485 millivolts. In various examples, the difference of fifteen (15) millivolts can be detectable by a component configured to detect or otherwise be sensitive to a voltage, such as an analog-to-digital converter (ADC) or other electronic component sensitive to voltage changes. Additionally or alternatively, the drivers 212, 214 and/or the terminator 204 can have reduced resistance, such as fourteen (14) Ohms, which can produce a greater voltage difference between the conforming and nonconforming interconnects 102 sufficient to be detected by an alternative voltage detector.

In such an example, the comparator 404 can alternatively be an ADC or other suitable voltage detector. The counter 410 can be dispensed with. The results of the ADC can be monitored and, as output from the ADC transitions from a logical "0" to a logical "1" the existence of a nonconforming interconnect 102 can be identified.

FIGS. 5A and 5B show circuit diagrams 500A, 500B (collectively 500) of the interconnect defect test at preconditioning for the test (500A) and during the test (500B) for a defective interconnect 102. The circuit diagrams 500A, 500B utilize a voltage mode driver, in contrast to a current mode driver as illustrated below in FIG. 7.

As illustrated, the circuits 500 incorporate transmitter-side resistance 502 and receiver-side resistance 504 illustrative of a condition of interconnects 102. In various examples, the interconnects 102 may not be defective, in which case each resistance 502, 504 can be zero (0) Ohms or approximately zero (0) Ohms. In various examples in which the interconnect 102 is defective, one or both of the resistance 502, 504 can have a non-zero resistance, such as approximately three (3) Ohms.

The preconditioning circuit diagram 500A shows that with switches 506, 508 both shut the voltage divider created by the drivers 212, 214 produces a divided voltage at a driver junction 510 of approximately 0.5 Volts based on a one (1) Volt supply voltage 512. With the pull-down switch 508 open in circuit 500B the driver junction 510 rises to one (1) Volt, producing the response curves illustrated herein.

FIG. 6 shows the simulation results based on various resistances for resistances 502, 504. The waveforms 600, 602, 604, 606 are measured on the receiver side of the capacitor 210, such as at a receiver-side pad 110. In the example of the test circuit 400, the logic from the comparator 404 is present on the receive side, though it is to be understood that the logic, such as a comparator, can be present on the transmitter side in addition or alternatively.

The waveform 600 represents the case when there is no interconnect defect, i.e., the resistances 502, 504 are approximately zero (0) Volts. The waveforms 602, 604 represents cases with, for instance, an at least partial via delamination, with the waveform 602 corresponding to the resistance 502 being approximately three (3) Ohms and the resistance 504 being approximately zero (0) Ohms and the waveform 604 corresponding to the resistance 502 being approximately zero (0) Ohms and the resistance 504 being approximately three (3) Ohms. (It is noted that, in various examples, the waveforms 602, 604 can overlap on the graph if the resistances 502, 504 are exactly the same.) The waveform 606 corresponds to essentially complete via delamination, where both resistances 502, 504 are approximately three (3) Ohms.

In an example, the counter 410 is started at around three hundred (300) nanoseconds and the RC decay crosses a 0.25 Volt reference voltage threshold 414 at approximately four hundred (400) nanoseconds. As illustrated, the waveform 600 corresponding to no via delamination crosses the threshold 414 approximately two hundred (200) nanoseconds difference in comparison with the waveform 602, and greater than two hundred (200) nanoseconds difference in comparison with the waveforms 604, 606, corresponding to via delamination. As measured by the counter 410, if the counter 410 corresponds to two (2) nanosecond cycles, via delamination would be identified on the basis of one hundred (100) counts of delay in crossing the threshold 414.

Figure 7:
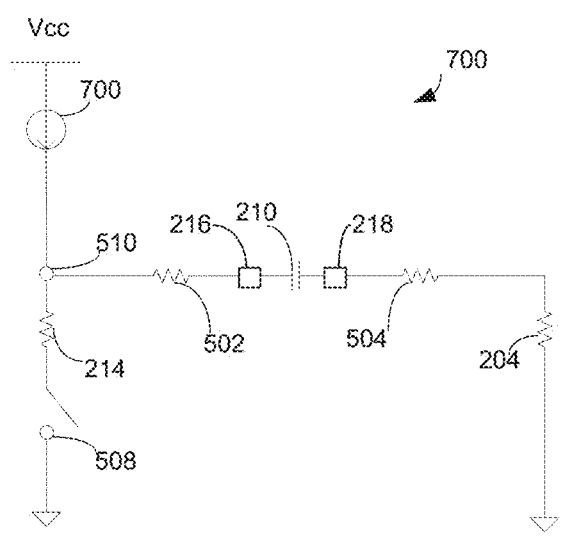
FIG. 7 is a circuit diagram of an interconnect defect test using a current mode driver, in an example embodiment.

FIG. 7 is a circuit diagram 700 of an interconnect defect test using a current mode driver. A constant current source 700 can be used in place of the pull-up driver 212. In an example, the current source 700 is a of 23.5 milliampere current source and the pull-down driver resistor 214 has a resistance of 42.5 Ohms, providing a voltage swing of one (1) Volt. In an alternative example, the current source can be 11.75 milliamperes.

Figure 8:
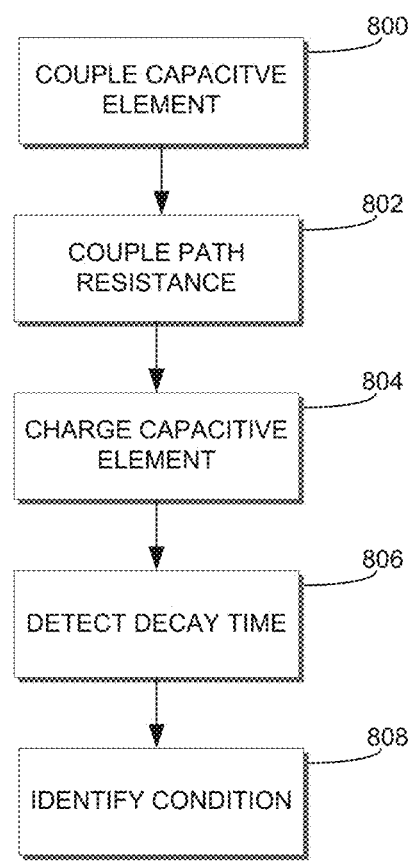
FIG. 8 is a flowchart for determining a condition of an electronic package component, in an example embodiment.

FIG. 8 is a flowchart for determining a condition of an electronic package component. While the flowchart is discussed with respect to systems and components disclosed herein, it is to be understood that the flowchart is applicable to any of a variety of suitable systems and devices.

At 800, a capacitive element, such as the capacitor 210, is coupled in series with the electronic package component, such as an interconnect 102.

At 802, a path resistance, such as a resistive terminator 204 and/or drivers 212, 214, is coupled to the capacitive element.

At 804, the capacitive element is electrically charged with a driver, such as the transmitter 208 and the preconditioning line 406. In an example, the driver is a voltage driver configured to drive a predetermined voltage over the capacitive element. In an example, the voltage driver comprises a voltage divider comprising a driver resistance, and wherein the driver resistance is a component of the path resistance. In an example, the driver is a current driver configured to drive a predetermined current over the capacitive element. In an example, the current driver comprises a constant current source.

In an example, the driver is coupled to a first terminal of the capacitive element and further comprising a terminator coupled to a second terminal of the capacitive element opposite the first terminal, wherein the terminator includes a terminator resistor, the terminator resistor being a component of the path resistance. In an example, the voltage detector is coupled to the terminator.

At 806, a time is detected for a charge on the capacitive element as coupled in series with the electronic package component to decay to a predetermined threshold is detected with a voltage detector, such as the comparator 404 and/or the edge detector 416.

At 808, the condition of the electronic package component is identified based on the time as detected. For example, the condition can be indicative of a conforming interconnect 102 or a non-conforming or otherwise defective interconnect 102. In an example, identifying the condition of the electronic package component is based on a time for a charge on the capacitive element as coupled in series with the electronic package component to decay to a predetermined threshold. In an example, the charge on the capacitive element decays to the predetermined threshold in a first time when the electronic package component has a resistance of approximately zero (0) Ohms and a second time greater than the first time when the electronic package component has a resistance of greater than zero (0) Ohms. In an example, the first time is indicative of the electronic package component being conforming and the second time is indicative of the electronic package component being nonconforming.

In an example, identifying the condition of the electronic package component is based on a maximum voltage on the capacitive element as coupled in series with the electronic package component in relation to a predetermined threshold. In an example, the maximum voltage is indicative of the electronic package component being nonconforming if the maximum voltage is less than the predetermined threshold, wherein the predetermined threshold is based on a maximum voltage of a conforming electronic package component.

Figure 9:
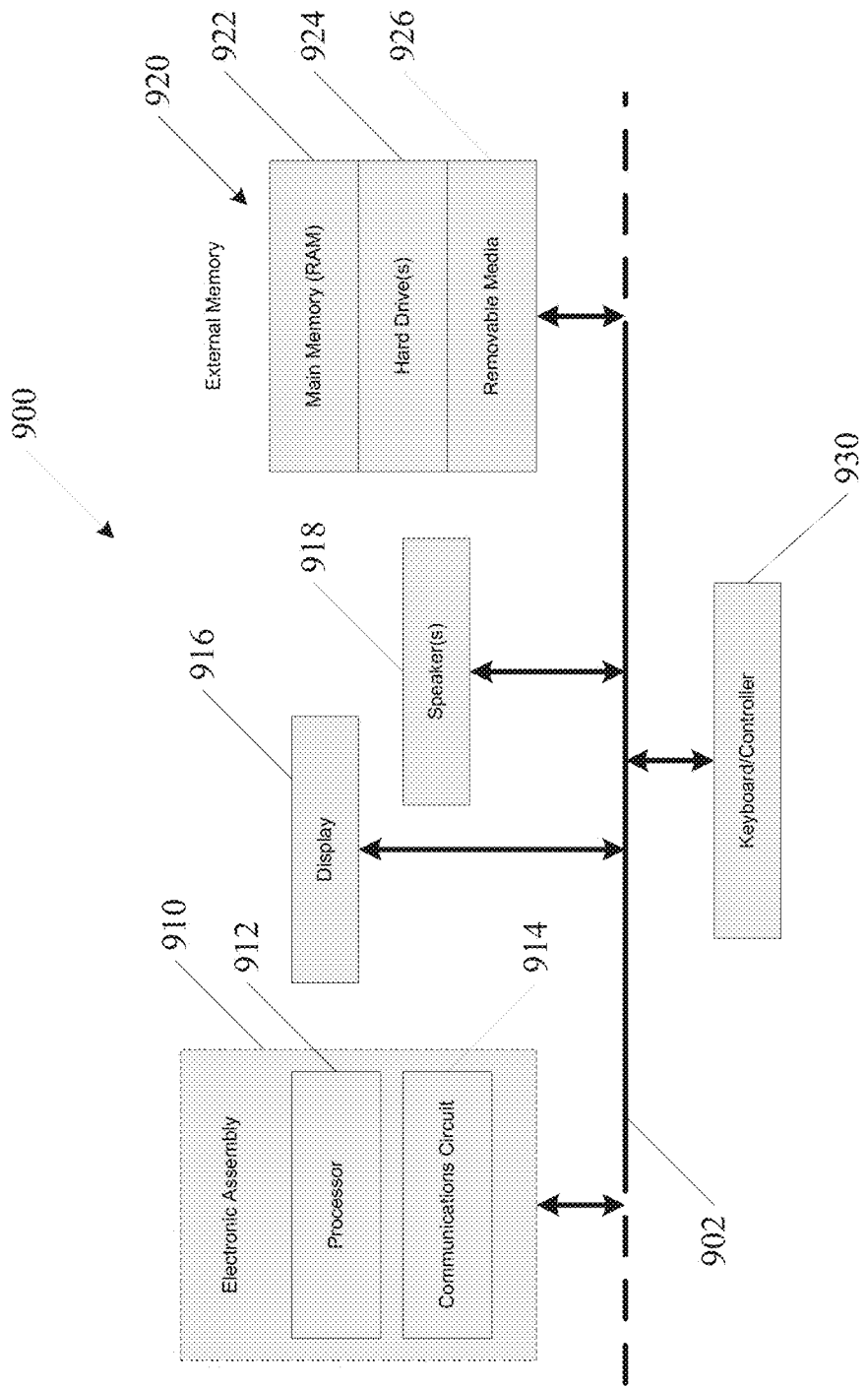
FIG. 9 is a block diagram of an electronic device 900 incorporating at least one package, in an example embodiment.

An example of an electronic device using semiconductor chips as described in the present disclosure is included to show an example of a higher level device application for the present invention. FIG. 9 is a block diagram of an electronic device 900 incorporating at least one package. The electronic device 900 is merely one example of an electronic system in which embodiments of the present invention can be used. Examples of electronic devices 900 include, but are not limited to personal computers, tablet computers, mobile telephones, personal data assistants, MP3 or other digital music players, etc. In this example, the electronic device 900 comprises a data processing system that includes a system bus 902 to couple the various components of the system. The system bus 902 provides communications links among the various components of the electronic device 900 and can be implemented as a single bus, as a combination of busses, or in any other suitable manner.

An electronic assembly 910 is coupled to the system bus 902. The electronic assembly 910 can include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 910 are a custom circuit, an application-specific integrated circuit (ASIC), or the like, such as, for example, one or more circuits (such as a communications circuit 914) for use in wireless devices like mobile telephones, pagers, personal data assistants, portable computers, two-way radios, and similar electronic systems. The IC can perform any other type of function.

The electronic device 900 can also include an external memory 920, which in turn can include one or more memory elements suitable to the particular application, such as a main memory 922 in the form of random access memory (RAM), one or more hard drives 924, and/or one or more drives that handle removable media 926 such as compact disks (CD), digital video disk (DVD), and the like.

The electronic device 900 can also include a display device 916, one or more speakers 918, and a keyboard and/or controller 930, which can include a mouse, trackball, touch screen, voice-recognition device, or any other device that permits a system user to input information into and receive information from the electronic device 900.

ADDITIONAL EXAMPLES

Example 1 may include subject matter (such as an apparatus, a method, a means for performing acts) that can include an electrical circuit, comprising a capacitive element configured to be coupled in series with an electronic package component, a path resistance electrically coupled to the capacitive element, a driver configured to electrically charge the capacitive element, and a voltage detector coupled to the capacitive element and configured to identify a condition of the electronic package component based on a measured voltage of the capacitive element.

In Example 2, the electrical circuit of Example 1 may optionally further include that the voltage detector is a decay detector configured to identify the condition of the electronic package component based on a time for a charge on the capacitive element as coupled in series with the electronic package component to decay to a predetermined threshold.

In Example 3, the electrical circuit of any one or more of Examples 1 and 2 may optionally further include that the voltage detector is a comparator with an input of a terminal of the capacitive element and a reference voltage being the predetermined threshold.

In Example 4, the electrical circuit of any one or more of Examples 1-3 may optionally further include that the charge on the capacitive element decays to the predetermined threshold in a first time when the electronic package component has a resistance of approximately zero (0) Ohms and a second time greater than the first time when the electronic package component has a resistance of greater than zero (0) Ohms.

In Example 5, the electrical circuit of any one or more of Examples 1-4 may optionally further include that the first time is indicative of the electronic package component being conforming and the second time is indicative of the electronic package component being nonconforming.

In Example 6, the electrical circuit of any one or more of Examples 1-5 may optionally further include that the driver is a voltage driver configured to drive a predetermined voltage over the capacitive element.

In Example 7, the electrical circuit of any one or more of Examples 1-6 may optionally further include that the voltage driver comprises a voltage divider comprising a driver resistance, and wherein the driver resistance is a component of the path resistance.

In Example 8, the electrical circuit of any one or more of Examples 1-7 may optionally further include that the driver is a current driver configured to drive a predetermined current over the capacitive element.

In Example 9, the electrical circuit of any one or more of Examples 1-8 may optionally further include that the current driver comprises a constant current source.

In Example 10, the electrical circuit of any one or more of Examples 1-9 may optionally further include that the driver is coupled to a first terminal of the capacitive element and further comprising a terminator coupled to a second terminal of the capacitive element opposite the first terminal, wherein the terminator includes a terminator resistor, the terminator resistor being a component of the path resistance.

In Example 11, the electrical circuit of any one or more of Examples 1-10 may optionally further include that the voltage detector is coupled to the terminator.

In Example 12, the electrical circuit of any one or more of Examples 1-11 may optionally further include that the voltage detector is configured to identify the condition of the electronic package component based on a maximum voltage on the capacitive element as coupled in series with the electronic package component in relation to a predetermined threshold.

In Example 13, the electrical circuit of any one or more of Examples 1-12 may optionally further include that the maximum voltage is indicative of the electronic package component being nonconforming if the maximum voltage is less than the predetermined threshold, wherein the predetermined threshold is based on a maximum voltage of a conforming electronic package component.

Example 14 may include subject matter (such as an apparatus, a method, a means for performing acts) that can include coupling a capacitive element in series with the electronic package component, coupling a path resistance to the capacitive element, electrically charging the capacitive element with a driver, detecting, with a voltage detector, a time for a charge on the capacitive element as coupled in series with the electronic package component to decay to a predetermined threshold, and identifying the condition of the electronic package component based on the time as detected.

In Example 15, the method of Example 14 may optionally further include that identifying the condition of the electronic package component is based on a time for a charge on the capacitive element as coupled in series with the electronic package component to decay to a predetermined threshold.

In Example 16, the method of any one or more of Examples 14 and 15 may optionally further include that the charge on the capacitive element decays to the predetermined threshold in a first time when the electronic package component has a resistance of approximately zero (0) Ohms and a second time greater than the first time when the electronic package component has a resistance of greater than zero (0) Ohms.

In Example 17, the method of any one or more of Examples 14-16 may optionally further include that the first time is indicative of the electronic package component being conforming and the second time is indicative of the electronic package component being nonconforming.

In Example 18, the method of any one or more of Examples 14-17 may optionally further include that identifying the condition of the electronic package component is based on a maximum voltage on the capacitive element as coupled in series with the electronic package component in relation to a predetermined threshold.

In Example 19, the method of any one or more of Examples 14-18 may optionally further include that the maximum voltage is indicative of the electronic package component being nonconforming if the maximum voltage is less than the predetermined threshold, wherein the predetermined threshold is based on a maximum voltage of a conforming electronic package component.

In Example 20, the method of any one or more of Examples 14-19 may optionally further include that the driver is a current driver configured to drive a predetermined current over the capacitive element.

Example 21 may include subject matter (such as an apparatus, a method, a means for performing acts) that can include a system comprising an electronic package component and an electrical circuit comprising a capacitive element configured to be coupled in series with the electronic package component, a path resistance electrically coupled to the capacitive element, a driver configured to electrically charge the capacitive element, and a voltage detector coupled to the capacitive element and configured to identify a condition of the electronic package component based on a measured voltage of the capacitive element.

In Example 22, the system of Example 21 may optionally further include that the voltage detector is a decay detector configured to identify the condition of the electronic package component based on a time for a charge on the capacitive element as coupled in series with the electronic package component to decay to a predetermined threshold.

In Example 23, the system of any one or more of Examples 21 and 22 may optionally further include that the voltage detector is a comparator with an input of a terminal of the capacitive element and a reference voltage being the predetermined threshold.

In Example 24, the system of any one or more of Examples 21-23 may optionally further include that the charge on the capacitive element decays to the predetermined threshold in a first time when the electronic package component has a resistance of approximately zero (0) Ohms and a second time greater than the first time when the electronic package component has a resistance of greater than zero (0) Ohms.

In Example 25, the system of any one or more of Examples 21-24 may optionally further include that the first time is indicative of the electronic package component being conforming and the second time is indicative of the electronic package component being nonconforming.

In Example 26, the system of any one or more of Examples 21-25 may optionally further include that the driver is a voltage driver configured to drive a predetermined voltage over the capacitive element.

In Example 27, the system of any one or more of Examples 21-26 may optionally further include that the voltage driver comprises a voltage divider comprising a driver resistance, and wherein the driver resistance is a component of the path resistance.

In Example 28, the system of any one or more of Examples 21-27 may optionally further include that the driver is a current driver configured to drive a predetermined current over the capacitive element.

In Example 29, the system of any one or more of Examples 21-28 may optionally further include that the current driver comprises a constant current source.

In Example 30, the system of any one or more of Examples 21-29 may optionally further include that the driver is coupled to a first terminal of the capacitive element and further comprising a terminator coupled to a second terminal of the capacitive element opposite the first terminal, wherein the terminator includes a terminator resistor, the terminator resistor being a component of the path resistance.

In Example 31, the system of any one or more of Examples 21-20 may optionally further include that the voltage detector is coupled to the terminator.

In Example 32, the system of any one or more of Examples 21-21 may optionally further include that the voltage detector is configured to identify the condition of the electronic package component based on a maximum voltage on the capacitive element as coupled in series with the electronic package component in relation to a predetermined threshold.

In Example 33, the system of any one or more of Examples 21-32 may optionally further include that the maximum voltage is indicative of the electronic package component being nonconforming if the maximum voltage is less than the predetermined threshold, wherein the predetermined threshold is based on a maximum voltage of a conforming electronic package component.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electrical circuit, comprising:
    an electronic package component;
    a capacitive element, different than the electronic package component, coupled in series with the electronic package component;
    a path resistance different than the electronic package component and the capacitive element, electrically coupled to the capacitive element;
    a driver configured to electrically charge the capacitive element; and
    a voltage detector coupled to the capacitive element and configured to identify a condition of the electronic package component based on a measured voltage of the capacitive element.

2. The electrical circuit of claim 1, wherein the voltage detector is component of a decay detector configured to identify the condition of the electronic package component based on a time for a charge on the capacitive element as coupled in series with the electronic package component to decay to a predetermined threshold.

3. The electrical circuit of claim 2, wherein the voltage detector is a comparator with an input of a terminal of the capacitive element and a reference voltage being the predetermined threshold.

4. The electrical circuit of claim 2, wherein the charge on the capacitive element decays to the predetermined threshold in a first time when the electronic package component has a resistance of approximately zero (0) Ohms and a second time greater than the first time when the electronic package component has a resistance of greater than zero (0) Ohms.

5. The electrical circuit of claim 4, wherein the first time is indicative of the electronic package component being conforming and the second time is indicative of the electronic package component being nonconforming.

6. The electrical circuit of claim 1, wherein the driver is a voltage driver configured to drive a predetermined voltage over the capacitive element.

7. The electrical circuit of claim 6, wherein the voltage driver comprises a voltage divider comprising a driver resistance, and wherein the driver resistance is a component of the path resistance.

8. The electrical circuit of claim 1, wherein the driver is a current driver configured to drive a predetermined current over the capacitive element.

9. The electrical circuit of claim 8, wherein the current driver comprises a constant current source.

10. The electrical circuit of claim 1, wherein the driver is coupled to a first terminal of the capacitive element and further comprising a terminator coupled to a second terminal of the capacitive element opposite the first terminal, wherein the terminator includes a terminator resistor, the terminator resistor being a component of the path resistance.

11. The electrical circuit of claim 10, wherein the voltage detector is coupled to the terminator.

12. The electrical circuit of claim 1, wherein the voltage detector is configured to identify the condition of the electronic package component based on a maximum voltage on the capacitive element as coupled in series with the electronic package component in relation to a predetermined threshold.

13. The electrical circuit of claim 12, wherein the maximum voltage is indicative of the electronic package component being nonconforming if the maximum voltage is less than the predetermined threshold, wherein the predetermined threshold is based on a maximum voltage of a conforming electronic package component.

14. A method for determining a condition of an electronic package component, comprising:
    coupling a capacitive element in series with the electronic package component, the electronic package component being different than the capacitive element;
    coupling a path resistance to the capacitive element, the path resistance different than the capacitive element and the electronic package component;
    electrically charging the capacitive element with a driver; and
    detecting, with a decay detector, a time for a charge on the capacitive element as coupled in series with the electronic package component to decay to a predetermined threshold; and identifying the condition of the electronic package component based on the time as detected.

15. The method of claim 14, wherein identifying the condition of the electronic package component is based on a time for a charge on the capacitive element as coupled in series with the electronic package component to decay to a predetermined threshold.

16. The method of claim 15, wherein the charge on the capacitive element decays to the predetermined threshold in a first time when the electronic package component has a resistance of approximately zero (0) Ohms and a second time greater than the first time when the electronic package component has a resistance of greater than zero (0) Ohms.

17. The method of claim 16, wherein the first time is indicative of the electronic package component being conforming and the second time is indicative of the electronic package component being nonconforming.

18. The method of claim 14, wherein identifying the condition of the electronic package component is based on a maximum voltage on the capacitive element as coupled in series with the electronic package component in relation to a predetermined threshold.

19. The method of claim 18, wherein the maximum voltage is indicative of the electronic package component being nonconforming if the maximum voltage is less than the predetermined threshold, wherein the predetermined threshold is based on a maximum voltage of a conforming electronic package component.

20. The method of claim 14, wherein the driver is a current driver configured to drive a predetermined current over the capacitive element.

* * * * *

UNITED STATES PATENT AND TRADEMARK OFFICE
CERTIFICATE OF CORRECTION

PATENT NO. : 9,658,288 B2
APPLICATION NO. : 15/207351
DATED : May 23, 2017
INVENTOR(S) : Thiruvengadam et al.

Page 1 of 1

It is certified that error appears in the above-identified patent and that said Letters Patent is hereby corrected as shown below:

In the Claims

Column 11, Line 56, Claim 1, delete "resistance" and insert --resistance,-- therefor Signed and Sealed this
Fourteenth Day of April, 2020

Andrei Iancu
*Director of the United States Patent and Trademark Office*